(12) United States Patent
Bhat et al.

(10) Patent No.: US 10,326,051 B2
(45) Date of Patent: Jun. 18, 2019

(54) LIGHT EMITTING DEVICE INCLUDING SHAPED SUBSTRATE

(71) Applicant: Lumileds LLC, San Jose, CA (US)

(72) Inventors: Jerome Chandra Bhat, Eindhoven (NL); Mark Melvin Butterworth, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 14/427,320

(22) PCT Filed: Sep. 5, 2013

(86) PCT No.: PCT/IB2013/058295
§ 371 (c)(1),
(2) Date: Mar. 11, 2015

(87) PCT Pub. No.: WO2014/041463
PCT Pub. Date: Mar. 20, 2014

(65) Prior Publication Data
US 2015/0243842 A1    Aug. 27, 2015

Related U.S. Application Data

(60) Provisional application No. 61/701,742, filed on Sep. 17, 2012.

(51) Int. Cl.
*H01L 33/20* (2010.01)
*H01L 33/00* (2010.01)
(Continued)

(52) U.S. Cl.
CPC .......... *H01L 33/20* (2013.01); *H01L 21/0242* (2013.01); *H01L 21/0254* (2013.01);
(Continued)

(58) Field of Classification Search
CPC ......... H01L 29/20; H01L 21/20; H01L 29/22; H01L 31/0256; H01L 31/0296;
(Continued)

(56) References Cited

U.S. PATENT DOCUMENTS 6,043,514 A    3/2000  Teraguchi
6,784,460 B2   8/2004  Ng et al.
(Continued)

FOREIGN PATENT DOCUMENTS

CN         1883058 A    12/2006
CN       102376834 A     3/2012
(Continued)

OTHER PUBLICATIONS

"GaN LiNbO3 Interface Formation Calculated from First Principles" Sanna et al, Applied Surface Science 256 (2010) p. 5740-5743.
(Continued)

*Primary Examiner* — William F Kraig
*Assistant Examiner* — Khatib A Rahman
(74) *Attorney, Agent, or Firm* — Volpe and Koenig, P.C.

(57) ABSTRACT

Embodiments of the invention include a semiconductor structure (23) including a light emitting layer. A substrate (10) comprising lithium is attached to the semiconductor structure (23). A surface of the substrate (10) forms an angle with a major plane of the semiconductor structure (23) that is between 60° and 75°.

16 Claims, 2 Drawing Sheets

(51) Int. Cl.
*H01L 33/02* (2010.01)
*H01L 21/02* (2006.01)
*H01L 33/50* (2010.01)

(52) U.S. Cl.
CPC .. *H01L 21/02433* (2013.01); *H01L 21/02458* (2013.01); *H01L 21/02505* (2013.01); *H01L 21/02587* (2013.01); *H01L 33/0066* (2013.01); *H01L 33/0079* (2013.01); *H01L 33/02* (2013.01); *H01L 33/505* (2013.01); *H01L 33/0095* (2013.01); *H01L 2933/0041* (2013.01)

(58) Field of Classification Search
CPC ......... H01L 33/00; H01L 31/12; H01L 33/20; H01L 33/066; H01L 33/0066
See application file for complete search history.

(56) References Cited

U.S. PATENT DOCUMENTS

| | | | |
|---|---|---|---|
| 6,878,969 | B2 | 4/2005 | Tanaka et al. |
| 7,078,319 | B2 | 7/2006 | Eliashevich et al. |
| 7,173,286 | B2* | 2/2007 | Doolittle ........................ 257/78 |
| 7,183,586 | B2 | 2/2007 | Ichihara et al. |
| 7,268,371 | B2 | 9/2007 | Krames et al. |
| 7,476,909 | B2 | 1/2009 | Nagai et al. |
| 7,691,651 | B2 | 4/2010 | Park |
| 7,943,944 | B2 | 5/2011 | Eisert et al. |
| 9,048,385 | B2 | 6/2015 | Sanga |
| 9,252,330 | B2 | 2/2016 | Isozaki et al. |
| 2003/0155574 | A1 | 8/2003 | Doolittle |
| 2004/0115845 | A1 | 6/2004 | Pan et al. |
| 2006/0001046 | A1* | 1/2006 | Batres et al. .................. 257/202 |
| 2007/0267646 | A1* | 11/2007 | Wierer et al. .................. 257/98 |
| 2008/0121903 | A1 | 5/2008 | Hiramatsu et al. |
| 2009/0085055 | A1* | 4/2009 | Peng ................. H01L 21/02642 257/103 |
| 2009/0200563 | A1 | 8/2009 | Goshonoo et al. |
| 2011/0186860 | A1* | 8/2011 | Enya ................. H01L 21/02389 257/76 |
| 2012/0193649 | A1 | 8/2012 | Donofrio et al. |
| 2012/0241809 | A1* | 9/2012 | Pan ........................ H01L 33/24 257/99 |
| 2013/0092950 | A1* | 4/2013 | Fujikura et al. ................. 257/76 |
| 2013/0244364 | A1* | 9/2013 | Gardner ................. C30B 23/025 438/47 |
| 2014/0339587 | A1* | 11/2014 | Kawaguchi ........... H01L 33/405 257/98 |
| 2015/0021622 | A1* | 1/2015 | Sugiura ................... H01L 33/20 257/76 |
| 2015/0108510 | A1* | 4/2015 | Urano ................... H01L 33/486 257/88 |

FOREIGN PATENT DOCUMENTS

| | | |
|---|---|---|
| EP | 0851244 A1 | 7/1996 |
| EP | 1667241 A1 | 6/2006 |
| JP | 7283437 A2 | 10/1995 |
| JP | 7288231 A2 | 10/1995 |
| JP | 2006196538 A2 | 7/2006 |

OTHER PUBLICATIONS

GaN Film Growth on LiNbO3 Surfaces UsingMolecular Beam Epitaxy Nam et al; Journal of Physics, Conference Series 187, (2009).
CN Office Action, Application 201380048228.1, dated Oct. 27, 2016, 112 pps.
TW Office Action, Application 102133707, dated Nov. 16, 2016, 10 pps.

* cited by examiner

LIGHT EMITTING DEVICE INCLUDING SHAPED SUBSTRATE

CROSS-REFERENCE TO PRIOR APPLICATIONS

This application is the U.S. National Phase application under 35 U.S.C. § 371 of International Application No. PCT/IB2013/058295, filed on Sep. 5, 2013, which claims the benefit of U.S. Patent Application No. 61/701,742, filed on Sep. 17, 2012. These applications are hereby incorporated by reference herein.

FIELD OF THE INVENTION

The present invention relates to a semiconductor light emitting device including a shaped substrate.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Conventionally, III-nitride devices are grown on a sapphire substrate by MOCVD. However, due to differences in lattice constant and coefficient of thermal expansion between the sapphire substrate and the III-nitride semiconductor material, defects are formed in the semiconductor during growth, which may limit the efficiency of III-nitride devices. Other substrates have been explored in an attempt to alleviate problems associated with growth on sapphire. For example, U.S. Pat. No. 7,173,286 describes "depositing III-nitride compounds on lithium niobate and/or lithium tantalate substrates".

SUMMARY

It is an object of the invention to provide a light emitting device with improved light extraction.

Embodiments of the invention include a semiconductor structure including a light emitting layer. A substrate comprising lithium is attached to the semiconductor structure. A surface of the substrate forms an angle with a major plane of the semiconductor structure that is between 60° and 75°.

A method according to embodiments of the invention includes providing a substrate comprising lithium attached to a semiconductor structure, the semiconductor structure including a light emitting layer. The method further includes shaping the substrate to form a surface disposed at an acute angle relative to a major plane of the semiconductor structure.

DETAILED DESCRIPTION

In embodiments of the invention, a III-nitride semiconductor structure is combined with a high refractive index substrate. The semiconductor structure may be grown on the substrate or bonded to the substrate. The substrate may be, for example, a substrate comprising lithium, lithium niobate tantalate ($LiNb_aTa_{1-a}O_3$) where $0 \leq a \leq 1$, $LiNbO_3$, $LiTaO_3$, or $LiVO_3$, $Al_xIn_yGa_{(1-x-y)}N$, and SiC. The substrate may be selected to have a refractive index that closely matches that of the III-nitride material in the device, and/or to have a lattice constant that closely matches that of III-nitride material. $LiNbO_3$ has a refractive index greater than 2.2. For example, at 450 nm, $LiNbO_3$ may have a refractive index of 2.38, which is well-matched to the refractive index of GaN, which may be 2.4 at the 450 nm wavelength of light. The lattice mismatch between GaN and $LiNbO_3$ may be about 6.9%, which is a much closer match than GaN and sapphire, which have a lattice mismatch in excess of 15%.

Figure 1:
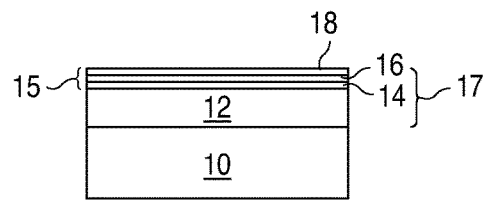
FIG. 1 illustrates a semiconductor structure grown on a high refractive index substrate.

FIG. 1 illustrates a semiconductor structure 17 grown on a substrate 10. Semiconductor structure 17 includes a buffer layer 12 grown in direct contact with substrate 10, followed by a III-nitride device structure 15. Substrate 10 may be any of the materials described above. The buffer layer may separate substrate 10 from III-nitride device structure 15 and may enable growth of the III-nitride device structure 15. In some embodiments, buffer layer 12 is not included and III-nitride device structure 15 is grown directly on substrate 10. In some embodiments, an n-type layer is grown directly on a single buffer layer 12, as illustrated in FIG. 1. In some embodiments, multiple buffer layers of the same or different composition are included in the device. For example, an aluminum containing buffer layer 12, such as the buffer layer described below, may be formed on substrate 10, then an additional buffer layer, such as a GaN buffer layer, that acts as a growth initiation layer for the device structure 15 may be grown between the buffer layer 12 and the device structure 15.

Buffer layer 12 may be, for example, AlGaN or AlN layer with a thickness of 0.5 to 70 nm deposited at a high temperature (i.e. between 900 and 1100° C.) or at a low temperature (i.e. <500° C.). After deposition, the buffer layer may be annealed, where the sample is held at an elevated temperature for a period of time under zero growth rate conditions. A buffer deposited at low temperature may be annealed at a temperature greater than the growth temperature. Alternatively, an AlN buffer layer 12 may be formed by depositing a thin layer (i.e. <0.5 nm) of aluminum on the surface of substrate 10, then exposing the aluminum layer to a nitrogen source to convert it to AlN. Aluminum deposition may be carried out at low temperature (i.e. between 100 and 500° C.). The AlN buffer layer may be annealed after exposure to the nitrogen source.

A device structure 15 is grown over buffer layer 12. The semiconductor device structure includes a light emitting or active region 16 sandwiched between an n-type region 14 and a p-type region 18. N-type region 14 may be grown first and may include multiple layers of different compositions and dopant concentration including, for example, preparation layers such as additional buffer layers or nucleation layers, layers which may be n-type or not intentionally doped, and n- or even p-type device layers designed for particular optical, material, or electrical properties desirable for the light emitting region to efficiently emit light. A light emitting or active region 16 is grown over the n-type region 14. Examples of suitable light emitting regions 16 include a single thick or thin light emitting layer, or a multiple quantum well light emitting region including multiple thin or thick light emitting layers separated by barrier layers. The light emitting layers in active region 16, in a device that emits visible light, are typically InGaN. A p-type region 18 may be grown over the light emitting region 16. Like the n-type region, the p-type region 18 may include multiple layers of different composition, thickness, and dopant concentration, including layers that are not intentionally doped, or n-type layers. The total thickness of all the semiconductor material in the device is less than 10 µm in some embodiments and less than 6 µm in some embodiments. In some embodiments, the p-type region is grown first, followed by the active region and the n-type region. In one example, n-type region 14 includes at least one n-type GaN layer, active region 16 includes InGaN quantum well layers separated by GaN or $Al_xIn_yGa_{(1-x-y)}N$ barrier layers, and p-type region 18 includes at least one p-type GaN layer.

Figure 2:
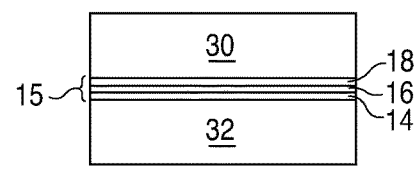
FIG. 2 illustrates a semiconductor structure grown on a conventional growth substrate and bonded to a transfer substrate.
Figure 3:
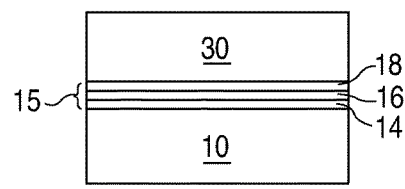
FIG. 3 illustrates the structure of FIG. 2 after removing the growth substrate and bonding the semiconductor structure to a high refractive index substrate.
Figure 4:
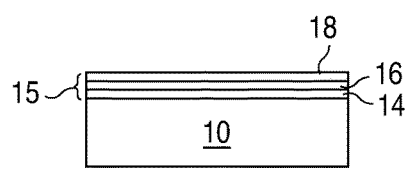
FIG. 4 illustrates the structure of FIG. 3 after removing the transfer substrate.

As an alternative to growing a device structure 15 on a high refractive index substrate 10, the n-type region 14, active region 16, and p-type region 18 may be grown on a conventional substrate then bonded to substrate 10, as illustrated in FIGS. 2, 3, and 4. In FIG. 2, n-type region 14, active region 16, and p-type region 18 are grown on a conventional substrate 32, such as sapphire or Si. The wafer including substrate 32 and device structure 15 is then bonded to a transfer wafer 30, for example by anodic bonding or by bonding via one or more dielectric bonding layers (not shown). The transfer substrate 30 supports the device structure 15 while the growth substrate 32 is removed. Transfer substrate 30 may be any suitable material including, for example, Si, glass, or sapphire.

In FIG. 3, the growth substrate 32 is removed by any suitable technique. For example, a sapphire growth substrate may be removed by laser lift off. A Si growth substrate may be removed by wet or dry etching. Removing the growth substrate exposes the bottom surface of n-type region 14. A high refractive index substrate 10, such as the lithium-containing substrates described above, is then bonded to the surface of n-type region 14 exposed by removing the growth substrate. Substrate 10 may be bonded to device structure 15 by, for example, by anodic bonding or by bonding via one or more dielectric bonding layers (not shown).

In FIG. 4, the transfer substrate 30 is removed, exposing the top surface of p-type region 18. Transfer substrate 30 may be removed by any suitable technique. For example, a sapphire transfer substrate may be removed by laser lift off, or a Si or glass transfer substrate may be removed by wet or dry etching. The structure remaining after removing transfer substrate 30 includes substrate 10 attached to device structure 15.

Either of the structures illustrated in FIG. 1 or FIG. 4 may then be processed into individual devices. Any suitable device structure may be used, such as a vertical device structure, a device structure where light is extracted through a surface on which the contacts are formed, or a flip chip device structure. To form a vertical device with a contact disposed on the substrate, some of the lithium-containing substrates described herein may be made conductive by reducing in $H_2$-containing atmosphere. The substrate may be doped with any suitable dopant including Mg, Cu, Mo, Mn, W, Cr, Co, Fe, and Li.

Figure 5:
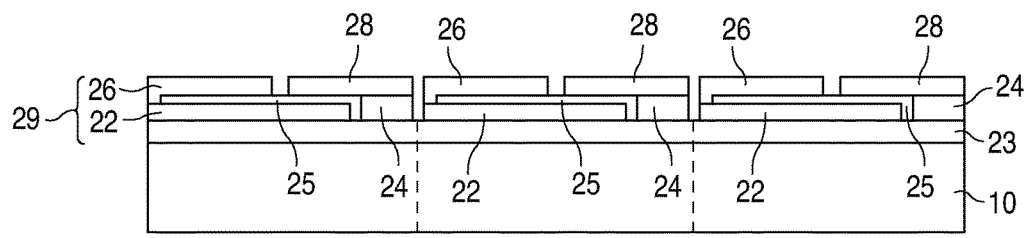
FIG. 5 illustrates a portion of a wafer processed into flip chip devices.

FIG. 5 illustrates a portion of a wafer processed into flip chip LED devices. To form flip chip devices, a metal p-contact 22 is formed on the p-type region of semiconductor structure 23, which may be only the device structure 15, as illustrated in FIG. 4, or the device structure 15 and buffer layer 12, as illustrated in FIG. 1. The p-contact may be reflective; for example, the p-contact may include at least one silver layer. The semiconductor structure 23 is patterned and etched by standard photolithographic operations to remove a portion of the entire thickness of the p-type region and a portion of the entire thickness of the light emitting region, to form a mesa (not shown in FIG. 5) which reveals a surface of the n-type region on which a metal n-contact 24 is formed. The mesa and p- and n-contacts may be formed in any suitable manner. Forming the mesa and p- and n-contacts is well known to a person of skill in the art. The p- and n-contacts 22 and 24 may be redistributed and electrically isolated from each other by a dielectric layer 25. For each device, at least one p-bonding pad 26 is electrically connected to p-contact 22. At least one n-bonding pad 28 is electrically connected to n-contact 24.

Alternatively, a semiconductor structure may be grown on a conventional growth substrate and processed into individual devices which include a structure, such as thick metal layers, to support the semiconductor structure during later removal of the growth substrate. The growth substrate may then be removed and a high refractive index substrate bonded to the semiconductor structure, for example via a high refractive index bonding layer. In some embodiments, a suitable bonding layer has a refractive index of at least 2.3. One example of a suitable bonding layer is a silicone layer, which may have a refractive index of about 1.5, infused with colloidally suspended particles of high index material such as titanium oxide, which may have a refractive index of about 2.5, such that the silicone/particle bonding layer has an effective refractive index of about 2.4.

Any of the wafers described above, after being processed to form individual devices, may then be diced into individual devices or groups of devices, as indicated by the dashed lines in FIG. 5. The wafer may be diced by any suitable technique including, for example, sawing, bevel sawing, water jet sawing, laser sawing, laser scribing and physical breaking, or a combination of these methods. Before or after dicing, the substrate 10 may be shaped to improve light extraction, as illustrated in FIGS. 6, 7, 8, 9, 10, and 11. In FIGS. 6, 7, 9, and 11, the semiconductor and metal layers illustrated in FIG. 5 are shown as structure 29. In FIGS. 6, 7, 9, and 11, the device is flipped over relative to the orientation illustrated in FIG. 5, such that the bonding pads 26 and 28 are at the bottom of the structures illustrated in FIGS. 6, 7, 9, and 11.

Figure 6:
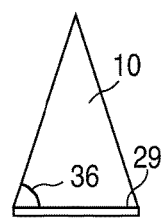
FIG. 6 illustrates a device with the substrate shaped into a pyramid.

In FIG. 6, the substrate 10 is shaped into a pyramid. The angle 36 between a major plane of the semiconductor structure and a side of the pyramid may be at least 60° in some embodiments and no more than 75° in some embodiments for optimal light extraction. The height of the pyramid may be at least 0.15 mm in some embodiments and no more than 3 mm in some embodiments. In some embodiments, the pyramid may be truncated such that the substrate 10 has a substantially flat top surface. The distance between the center of the active region and the reflective p-contact may be between $0.35\lambda$ and $0.5\lambda$, where $\lambda$ is the wavelength of light emitted by the light emitting layers in the semiconductor structure, such that light emitted from the active region can escape the pyramid.

Substrate 10 may be shaped into a pyramid by any suitable technique, including photolithography and full- or part-etching. For example, $LiNbO_3$ may be wet etched in an $Hf/HNO_3$ mix, or dry etched in $CF_4$ or another suitable fluoride-containing chemistry. In the case of photolithography and dry etching, the shape of the pyramid may be formed by managing the differential etch rate of the $LiNbO_3$ and the photomask, which is typically a polymer.

Figure 7:
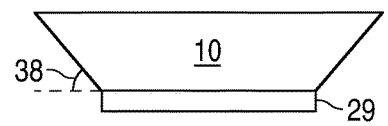
FIG. 7 illustrates a device with the substrate shaped into a truncated, inverted pyramid.

In FIG. 7, the substrate 10 is shaped into a truncated, inverted pyramid. The angle 38 between a major plane of the semiconductor structure and a side of the pyramid may be at least 60° in some embodiments and no more than 75° in some embodiments for optimal light extraction. (As used herein, a major plane of the semiconductor structure refers to, for example, a surface perpendicular to the growth direction.) The height of the truncated inverted pyramid may be at least 0.5 mm in some embodiments and no more than 3 mm in some embodiments. A truncated, inverted pyramid may be formed by full- or part-bevel sawing.

Other shapes besides the shapes illustrated in FIGS. 6 and 7 may be formed by etching or sawing.

Figure 8:
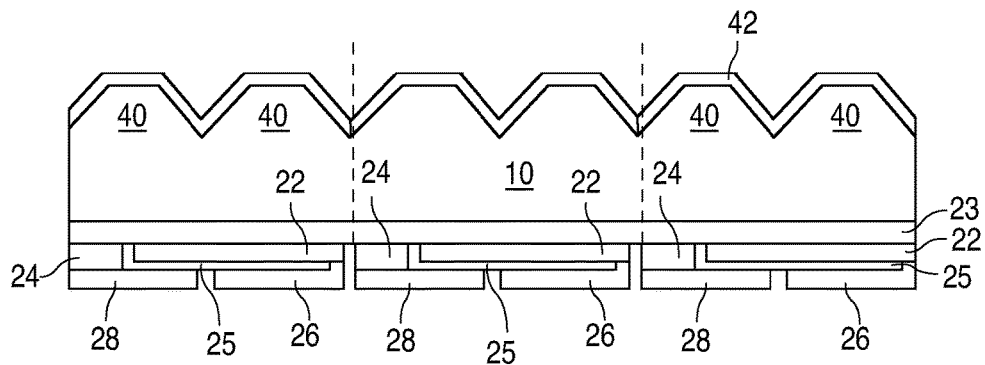
FIG. 8 illustrates a portion of a wafer of flip chip devices including shaped substrates and a wavelength converting layer.

Though FIGS. 6 and 7 illustrated a single feature, i.e. a pyramid or truncated, inverted pyramid, corresponding to each device 29, multiple features may be formed over a single device, as illustrated in FIG. 8. In the structure illustrated in FIG. 8, multiple truncated pyramids 40 are formed over each device. Individual devices are indicated by the dashed lines. Two truncated pyramids per device are illustrated in the cross section of FIG. 8. The truncated pyramids may be, for example, at least 0.2 mm×0.2 mm in some embodiments, at least 1 mm×1 mm in some embodiments, no more than 2 mm×2 mm in some embodiments, and no more than 3 mm×3 mm in some embodiments. The sidewalls may be disposed at an angle between 60° and 75° relative to the bottom surface of the device. Larger devices may need taller truncated pyramids in order to get the same extraction efficiency gains as in a smaller device. The areas between pyramids 40 are etched or sawed as deep as possible to maximize light extraction. However, if the structure gets too thin between pyramids 40, the structure may break at this stress-concentration point during handling. In some embodiments, the substrate thickness between pyramids 40 is at least 100 µm.

In some embodiments, features smaller than the wavelength of light (i.e. pyramids, truncated pyramids, rods, domes, or any other suitable shape smaller than, for example, 450 nm wide at the base) are formed by etching.

In some embodiments, as illustrated in FIG. 8, a wavelength converting layer 42 may be formed over the shaped substrate 10. Wavelength converting layer 42 often includes one or more wavelength converting materials disposed in a transparent material. Wavelength converting material(s) absorb light emitted by the light emitting layers of the LED and emit light of a different wavelength. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure.

The wavelength converting material(s) may be conventional phosphors, organic phosphors, quantum dots, organic semiconductors, II-VI or III-V semiconductors, II-VI or III-V semiconductor quantum dots or nanocrystals, dyes, polymers, or materials that luminesce. Any suitable powder phosphor may be used, including but not limited to garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as (Ca,Sr)$AlSiN_3$:Eu and $(Ca,Sr,Ba)_2Si_5N_8$:Eu.

The transparent material may be, for example, silicone, epoxy, glass, or any other suitable material. Wavelength converting layer 42 may be formed by screen printing, spray coating, stenciling, molding, laminating, electrophoresis, or any other suitable technique. Wavelength converting layer 42 may include a single wavelength converting material, a mixture of wavelength converting materials, or multiple wavelength converting materials formed as separate layers rather than mixed together. Wavelength converting materials emitting different colors of light may be disposed in separate regions or mixed together.

The thickness of wavelength converting layer 42 depends on the wavelength converting materials and the deposition technique. The thickness of the wavelength converting regions may be at least 0.5 µm in some embodiments, at least 2 µm in some embodiments, at least 40 µm in some embodiments, no more than 60 µm in some embodiments, and no more than 100 µm in some embodiments.

In one example, red- and green-emitting powder phosphors are mixed with silicone. The mixture is cast into a film. The phosphor materials and amounts of phosphor mixed into the silicone are selected to complement the blue light emitted by the LED, such that the mixed blue, green, and red light meets the specification for a given application. The phosphor-loaded silicone film is laminated over substrate 10.

Figure 9:
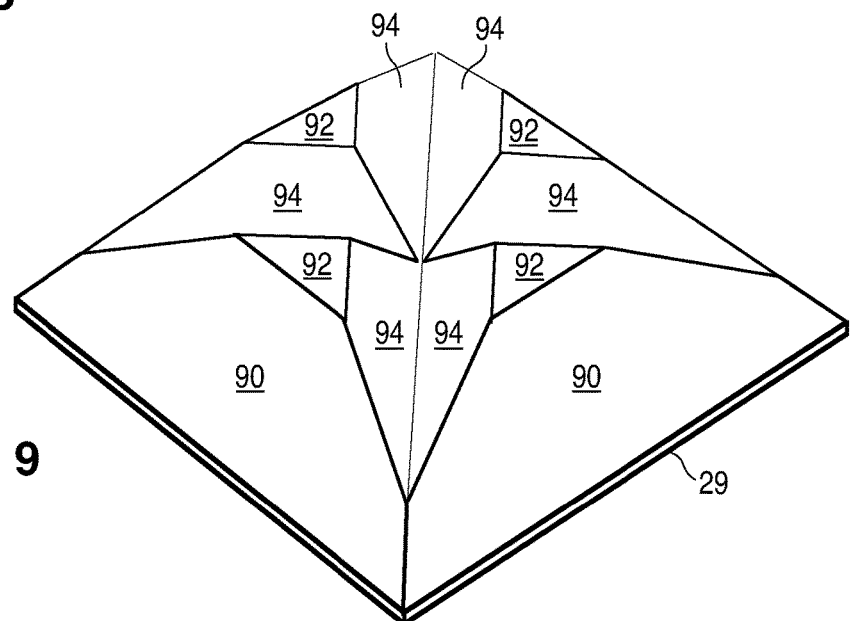
FIG. 9 illustrates a device with the substrate shaped to improve light extraction.
Figure 10:
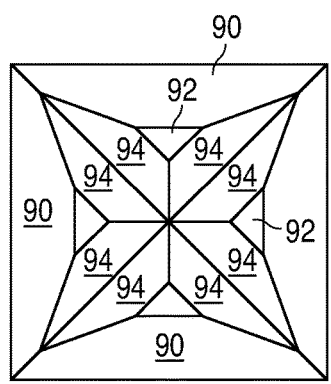
FIG. 10 is a top view of the structure of FIG. 9.
Figure 11:
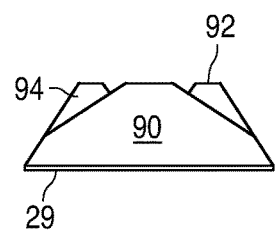
FIG. 11 is a side view of the structure of FIG. 9.

FIG. 9 illustrates a device with a substrate shaped for light extraction. FIG. 10 is a top view of the structure illustrated in FIG. 9 and FIG. 11 is a side view of the structure illustrated in FIG. 9. The device of FIGS. 9, 10, and 11 includes outer walls 90 that are angled toward the center of the chip. The angle of walls 90 may be at least 60° in some embodiments and no more than 75° in some embodiments, relative to the bottom surface of the device. The pyramid formed by outer walls 90 is truncated, leaving substantially flat regions 92 on the top surface of the substrate. The device further includes inner angled walls 94 that form two intersecting notches that diagonally bisect the truncated pyramid. The angle of walls 94 may be at least 60° in some embodiments and no more than 75° in some embodiments, relative to the bottom surface of the device. Though in FIG. 9 two intersecting notches with two flat walls per notch are illustrated, other shapes such as rounded or textured walls, a different arrangement of facets, or additional facets, are contemplated and included within the scope of the invention.

The devices described above may have advantages over conventional devices. Because the substrate is a high refractive index material, light extraction from the semiconductor structure is facilitated. The substrate need not be removed and the semiconductor material need not be roughened for light extraction, which may simplify processing. In addition, the wavelength converting layer 42 may be spaced apart from the semiconductor structure by the substrate, which may improve the efficiency of the wavelength converting material.

Though in the examples below the semiconductor light emitting device are III-nitride LEDs that emits blue or UV light, semiconductor light emitting devices besides LEDs such as laser diodes and semiconductors made from other materials systems such as III-phosphide or III-arsenide devices may be within the scope of the invention.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A device comprising: a substrate comprising lithium, the substrate having a first surface and a second surface opposite the first surface; and a semiconductor structure comprising a light emitting layer, the semiconductor structure having a first surface and a second surface opposite the first surface, the first surface of the semiconductor structure disposed adjacent the first surface of the substrate, at least a portion of the second surface of the substrate is shaped into at least one truncated pyramid, each truncated pyramid including four outer walls, each of the four outer walls of each truncated pyramid being angled toward a center of the truncated pyramid and adjoining two adjacent side walls of the same truncated pyramid at respective edges, wherein an intersecting notch is formed in each of the respective edges, each intersecting notch having side walls that form an angle between 600 and 750 relative to the second surface of the semiconductor structure.

2. The device of claim 1, wherein the substrate comprises lithium niobate tantalate (LiNb$_a$Ta$_{1-a}$O$_3$) where 0≤a≤1.

3. The device of claim 1, wherein the second surface of the substrate is part of a feature formed in the substrate, wherein a plurality of features are formed over a portion of the light emitting layer corresponding to a single light emitting device.

4. The device of claim 1, further comprising a wavelength converting layer disposed over the second surface of the substrate.

5. A method comprising:
providing a substrate comprising lithium, the substrate having a first surface and a second surface opposite the first surface, wherein a semiconductor structure comprising a light emitting layer and having a first surface and a second surface opposite the first surface is disposed adjacent the first surface of the substrate; and
shaping the second surface of the substrate such that at least a portion of the second surface of the substrate is shaped into at least one truncated pyramid, each truncated pyramid including four outer walls, each of the four outer walls of each truncated pyramid being angled toward a center of the truncated pyramid and adjoining two adjacent side walls of the same truncated pyramid at respective edges, an intersecting notch is formed in each of the respective edges, each intersecting notch having side walls that form an angle between 60° and 75° relative to the second surface of the semiconductor structure.

6. The method of claim 5, wherein the providing the substrate comprising lithium further comprises growing the semiconductor structure on the substrate comprising lithium.

7. The method of claim 5, wherein the providing the substrate comprising lithium further comprises:
growing the semiconductor structure on a growth substrate; and
after the growing, bonding the semiconductor structure to the substrate comprising lithium.

8. The method of claim 5, wherein the shaping comprises sawing.

9. The method of claim 5, wherein the shaping comprises etching.

10. The method of claim 5, wherein the shaping comprises forming at least one pyramid.

11. The method of claim 5, wherein the substrate comprises one of lithium niobate tantalate (LiNb$_a$Ta$_{1-a}$O$_3$) where 0≤a≤1, LiN$_b$O$_3$, LiTaO$_3$, and LiVO$_3$.

12. The method of claim 5, further comprising disposing a wavelength converting layer over the substrate.

13. The device of claim 1, wherein each of the four outer walls of each truncated pyramid forms an angle of between 60° and 75° with the second surface of the semiconductor structure.

14. The method of claim 5, wherein each of the four outer walls of each truncated pyramid forms an angle of between 60° and 75° with the second surface of the semiconductor structure.

15. The device of claim 1, wherein each truncated pyramid has an upper surface that is substantially parallel with the second surface of the semiconductor structure such that the intersecting notches form four regions atop the truncated pyramid that are substantially parallel with the second surface of the semiconductor structure and respectively adjoin each of the intersecting notches.

16. The method of claim 5, wherein each truncated pyramid has an upper surface that is substantially parallel with the second surface of the semiconductor structure such that the intersecting notches form four regions atop the truncated pyramid that are substantially parallel with the second surface of the semiconductor structure and respectively adjoin each of the intersecting notches.

* * * * *